United States Patent
Qoutb et al.

(10) Patent No.: US 12,320,848 B2
(45) Date of Patent: Jun. 3, 2025

(54) SUPERCONDUCTIVE INTEGRATED CIRCUIT DEVICES WITH ON-CHIP TESTING

(71) Applicant: Synopsys, Inc., Sunnyvale, CA (US)

(72) Inventors: Abdelrahman G. Qoutb, Beaverton, OR (US); Eby G. Friedman, Rochester, NY (US); Robert E. Freeman, Menlo Park, CA (US); Jamil Kawa, Campbell, CA (US); Stephen Robert Whiteley, Sunnyvale, CA (US)

(73) Assignee: Synopsys, Inc., Sunnyvale, CA (US)

( * ) Notice: Subject to any disclaimer, the term of this patent is extended or adjusted under 35 U.S.C. 154(b) by 106 days.

(21) Appl. No.: 18/237,809

(22) Filed: Aug. 24, 2023

(65) Prior Publication Data

US 2025/0067802 A1 Feb. 27, 2025

(51) Int. Cl.
| | | |
|---|---|---|
| *G01R 31/3177* | (2006.01) | |
| *G01R 31/317* | (2006.01) | |
| *G01R 33/035* | (2006.01) | |
| *H03K 3/38* | (2006.01) | |
| *H03K 19/195* | (2006.01) | |
| *H10N 60/12* | (2023.01) | |

(52) U.S. Cl.
CPC ... *G01R 31/3177* (2013.01); *G01R 31/31723* (2013.01); *G01R 31/31724* (2013.01); *G01R 33/035* (2013.01); *H03K 3/38* (2013.01); *H03K 19/195* (2013.01); *H03K 19/1954* (2013.01); *H10N 60/12* (2023.02)

(58) Field of Classification Search
CPC .......... G01R 31/3177; G01R 31/31723; G01R 31/31724; G01R 33/035; H03K 19/195; H03K 19/1954; H03K 3/38; H10N 60/12
USPC .................................................... 714/726
See application file for complete search history.

(56) References Cited

U.S. PATENT DOCUMENTS

| | | | | |
|---|---|---|---|---|
| 5,389,837 A | * | 2/1995 | Hietala | H03K 19/195 327/186 |
| 11,233,516 B1 | * | 1/2022 | Whiteley | H03K 19/0008 |
| 11,342,919 B1 | * | 5/2022 | Whiteley | H03K 19/195 |
| 11,641,194 B1 | * | 5/2023 | Whiteley | H10N 60/10 327/199 |
| 11,747,196 B1 | * | 9/2023 | Jafari-Salim | H10N 69/00 250/208.1 |

(Continued)

OTHER PUBLICATIONS

Krylov et al., Test Point Insertion for RSFQ Circuits, 2017, IEEE, pp. 1-4. (Year: 2017).*

(Continued)

*Primary Examiner* — John J Tabone, Jr.
(74) *Attorney, Agent, or Firm* — Patterson + Sheridan, LLP

(57) ABSTRACT

On-chip testing of a superconductive integrated circuit device includes receiving a superconductive circuit design having superconductive logic elements. Further, a first testability characteristic for first test circuitry at a first node within the superconductive circuit design is determined. The first testability characteristic corresponds to one or more of a test generation control level and a test observability control level. An updated superconductive circuit design from the superconductive circuit design is generated based on the first testability characteristic for the first test circuitry. The superconductive circuit design includes the first test circuitry at the first node.

14 Claims, 12 Drawing Sheets

(56) References Cited

U.S. PATENT DOCUMENTS

| | | | | |
|---|---|---|---|---|
| 11,848,676 | B2* | 12/2023 | Whiteley | G06N 10/00 |
| 11,915,102 | B2* | 2/2024 | Ghibaudi | G06N 10/80 |
| 12,041,858 | B1* | 7/2024 | Kawa | H10N 60/12 |
| 2021/0359672 | A1* | 11/2021 | Mumford | H03K 19/1952 |
| 2022/0149841 | A1* | 5/2022 | Whiteley | H10N 60/12 |
| 2022/0399145 | A1* | 12/2022 | Kirichenko | G06N 10/40 |
| 2023/0145418 | A1* | 5/2023 | Whiteley | G06N 10/00 |
| | | | | 341/157 |
| 2023/0210022 | A1* | 6/2023 | Herr | H10N 60/805 |
| | | | | 257/31 |
| 2024/0428970 | A1* | 12/2024 | Kirichenko | H01F 6/006 |

OTHER PUBLICATIONS

Kerkhoff et al., Testability Issues in Superconductor Electronics, 2004, IEEE, pp. 1-6. (Year: 2004).*

Hashimoto et al., Clock-driven On-chip Testing for Superconductor Logic Circuits, Jun. 1999, IEEE, vol. 9, No. 2, pp. 3169-3172. (Year: 199).*

Krylov, et al. "Design for Testability of SFQ Circuits" 2017 IEEE transactions on Applied Superconductivity, vol. 27, No. 8, Dec. 2017, consists of 7 pages.

Abdelrahman G. Qoutb, "Emerging Technologies for Beyond Conventional Compute Systems", Department of Electrical and Computer Engineering Arts Sciences and Engineering Edmund A. Hajim School of Engineering and Applied Sciences, University of Rochester, Rochester, New York, 2022.

* cited by examiner

| | Area Overhead | | | Detection Time(ps) | Delay Overhead $T_{Delay}$ (ps) | Power Overhead (fW)/Calculation |
|---|---|---|---|---|---|---|
| | JJ | L | R | | | |
| Test Extraction Circuitry | 5 | 4 | 4 | 7 | 0 | 0.513 |
| Test Insertion Circuitry | 8 | 5 | 3 | NA | Since $T_{Delay} + T_{combinational} < T_{CLK}$ | Normal: 0.275 Test:0.27 |
| Hybrid Test Circuitry | 13 | 9 | 7 | 18 | | Normal: 0.788 Test:0.781 |

SUPERCONDUCTIVE INTEGRATED CIRCUIT DEVICES WITH ON-CHIP TESTING

GOVERNMENT LICENSE RIGHTS

This invention was made with United States (U.S.) government support under Contract No. W911NF-17-9-0001 awarded by the U.S. Army Research Office. The U.S. government has certain rights in the invention.

TECHNICAL FIELD

The present disclosure relates to on-chip testability of superconductive integrated circuit (IC) devices, and, in particular to testing circuitry of a superconductive IC device for on-chip testing.

BACKGROUND

Superconductive electronics include superconducting logic circuits (or logic gates) that use superconducting properties for operation. Superconducting logic circuits use a single flux quanta (SFQ), or a magnetic flux quanta, to encode, process, and transport data within the corresponding integrated circuit (IC) device. Such logic circuits are referred to as SFQ circuits. SFQ circuits include Josephson junctions and passive elements such as inductors, resistors, transformers, and/or transmission lines.

Superconductive electronics have an improved power efficiency over other circuit technologies (e.g., a complementary metal-oxide semiconductor (CMOS) technology, among others). Superconductive electronics have zero electrical resistance, and accordingly, the amount of energy used to transmit bits within the corresponding electronic device is minimized, improving the power efficiency of the IC device.

SUMMARY

In one example, a method includes receiving a superconductive circuit design having superconductive logic elements. Further, the method includes determining a first testability characteristic for first test circuitry at a first node within the superconductive circuit design. The first testability characteristic corresponds to one or more of a test generation control level and a test observability control level. The method further includes generating an updated superconductive circuit design from the superconductive circuit design based on the first testability characteristic for the first test circuitry. The superconductive circuit design includes the first test circuitry at the first node.

In one example, a non-transitory computer readable medium comprising stored instructions, which when executed by a processor, cause the processor to receive a superconductive circuit design having superconductive logic elements. Further, the processor determines a first testability characteristic for first test circuitry at a first node within the superconductive circuit design. The first testability characteristic corresponds to one or more of a test generation control level and a test observability control level. The processor further generates an updated superconductive circuit design from the superconductive circuit design based on the first testability characteristic of the first test circuitry. The superconductive circuit design includes the first test circuitry at the first node.

In one example, test circuitry includes a splitter circuit that outputs a test output signal via a first test output node of a first path of the splitter circuit based on a first input signal and connects to a first node of a superconductive circuit design via a second output node of a second path of the splitter circuit. The splitter circuit includes first current sources, first Josephson junctions, and first inductors.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
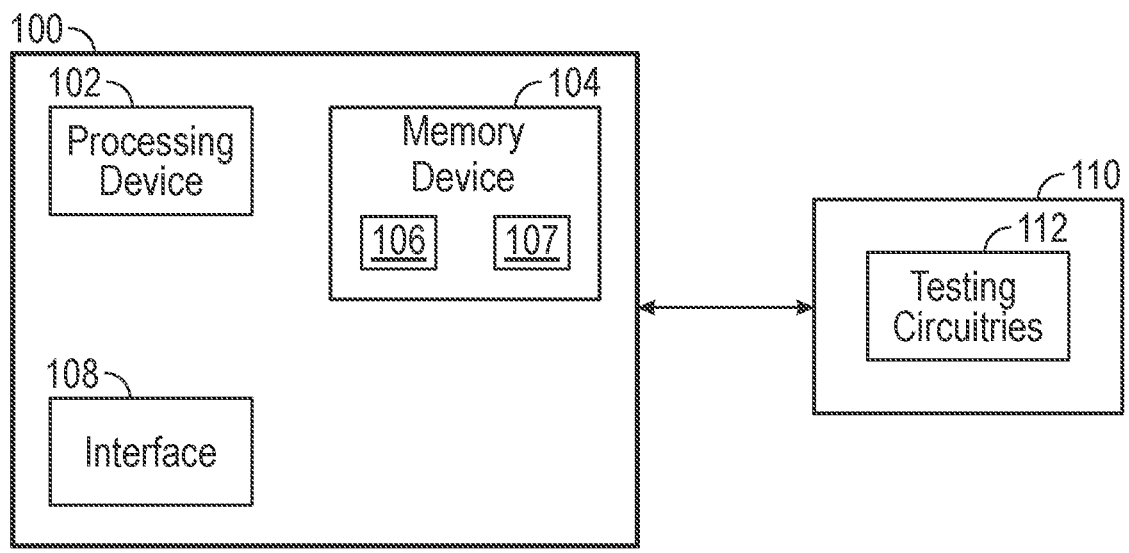
FIG. 1 illustrates a block diagram of a testing device and a superconductive integrated circuit (IC) device in accordance with some embodiments of the present disclosure.

Aspects of the present disclosure relate to superconductive integrated circuit devices with on-chip testing. Superconductive integrated circuit (IC) devices provide low energy per operation, lossless interconnects at direct current (DC), zero static power, operation at clock frequencies exceeding 100 gigahertz (GHz), and an interface with quantum computing systems. Superconductive IC devices may include one or more chips.

Superconductive IC devices include superconducting logic circuits that use single flux quanta (SFQ), or a magnetic flux quanta, to encode, process, and transport data within the corresponding superconductive IC device. SFQ logic is a superconductive logic family for low power, high performance cryogenic computing. Cryogenic computing operates at temperatures of about −300° F. (or about −150° C.). SFQ circuits include Josephson junctions and passive elements such as inductors, resistors, transformers, and/or transmission lines. The SFQ circuits within a superconductive IC device may include hundreds of thousands (e.g., about 800,000 or more) of Josephson junctions, operating at sub-terahertz clock frequencies, increasing the complexity of the corresponding superconductive IC device. However, achieving high reliability within a superconductive IC device is difficult due to the dimensional scaling, types of materials and devices used within superconductive IC devices, and severe operating conditions (e.g., operating in cryogenic temperatures and/or operating at sub-terahertz frequencies) of superconductive IC devices.

The reliability challenges, combined with yield issues of superconductive IC devices, are exacerbated by the manufacturing technologies of superconductive IC devices. Reliability and yield issues are categorized by the failure paths (sequence of faults due to a physical failure) and failure mechanisms (physical cause of the failure) within the superconductive IC devices. During design, testing, and manufacturing, determining the defects and faults of superconductive IC devices enhances the lifetime operation of the superconductive IC device. Defects and faults are detected by applying input test signals to the circuit elements of an electronic device, receiving corresponding output test signals, and using the output test signals to detect defects and faults within the electronic device. A fault coverage of a superconductive IC device corresponds to the quantity, type, and location of defects and faults that can be detected within a superconductive IC device. Improving the fault coverage, improves the reliability and yield of a superconductive IC device.

Fault coverage is improved by using design for testability (DFT) techniques to enhance the controllability and observability of the internal nodes within a superconductive IC device. Further detection methods are applied to the output signals received from a superconductive IC devices to detect defects and faults within the superconductive IC devices.

Previously, complementary metal-oxide semiconductor (CMOS) technology (or other processor technologies) DFT techniques were modified and applied to superconductive IC devices to detect defects and faults within the superconductive IC devices. However, such technologies are not able to provide the controllability and/or observability to detect the defects and faults within a superconductive IC device to increase the fault coverage of the superconductive IC device.

In one example, the SFQ circuit logic operates at sub-terahertz clock frequencies in a cryogenic environment, which differs from CMOS circuit logic. Further, as compared to signals within CMOS circuit logic, in SFC circuit logic, an SFQ signal is represented by the existence of an SFQ pulse. Further, observation of an internal node within a CMOS IC device is achieved by direct probing, while in SFQ systems, a test extraction module is used to non-destructively readout the signal of an internal node. In one or more examples, as SFQ circuit logic gates are clocked and latched within at least one storage loop, several clock signal cycles are used to produce an output. Accordingly, the number of clock cycles is used to test SFQ IC devices. The fan-out of SFQ logic gates and flip-flops within an SFQ circuit design is less than that of a CMOS circuit design. Accordingly, as will be described in greater detail in the following, a splitter circuit element is used to provide an additional output or outputs for test. In view of the differences between SFQ logic gates and CMOS logic gates, the use of standard CMOS-based DFT techniques may not be applied to SFQ IC devices.

The DFT techniques described herein enhance the controllability and observability of the internal nodes within superconductive IC devices to identify specific defects and faults, improving the fault coverage of the superconductive IC devices. The DFT techniques described herein provide on-chip testing circuitries for superconductive IC devices. For example, the DFT techniques described herein determine the quantity of test nodes, the type of test nodes, and location of test nodes to implement within superconductive IC devices. Further, the test modules described herein include a test insertion module, a test extraction module, and a hybrid test module (e.g., a test module that inputs a test signal input and outputs an output test signal.

Technical advantages of the present disclosure include, but are not limited to DFT techniques that improve the test controllability and the test observability of the internal nodes within a chip or chips of superconductive IC devices. Accordingly, the DFT techniques described herein improve the fault coverage associated with the superconductive IC devices, improving the reliability and yield of manufacturing the superconductive IC devices.

FIG. 1 illustrates a testing device 100 for detecting defects and/or faults within the superconductive IC device 110. The testing device 100 outputs test signals to the test circuitries 112 of the superconductive IC device 110 and receives output test signals from the test circuitries 112 of the superconductive IC device 110. In one or more examples, the testing device 100 determines the quantity of test circuitries, the type of test circuitries, and the location of test circuitries within a circuit design (e.g., the superconductive circuit design 106), which is used to manufacture the superconductive IC device 110.

The superconductive IC device 110 includes test circuitries 112 and SFQ circuit logic (e.g., Josephson junctions and/or passive elements (e.g., inductors, resistors, transformers, and/or transmission lines)).

Figure 16:
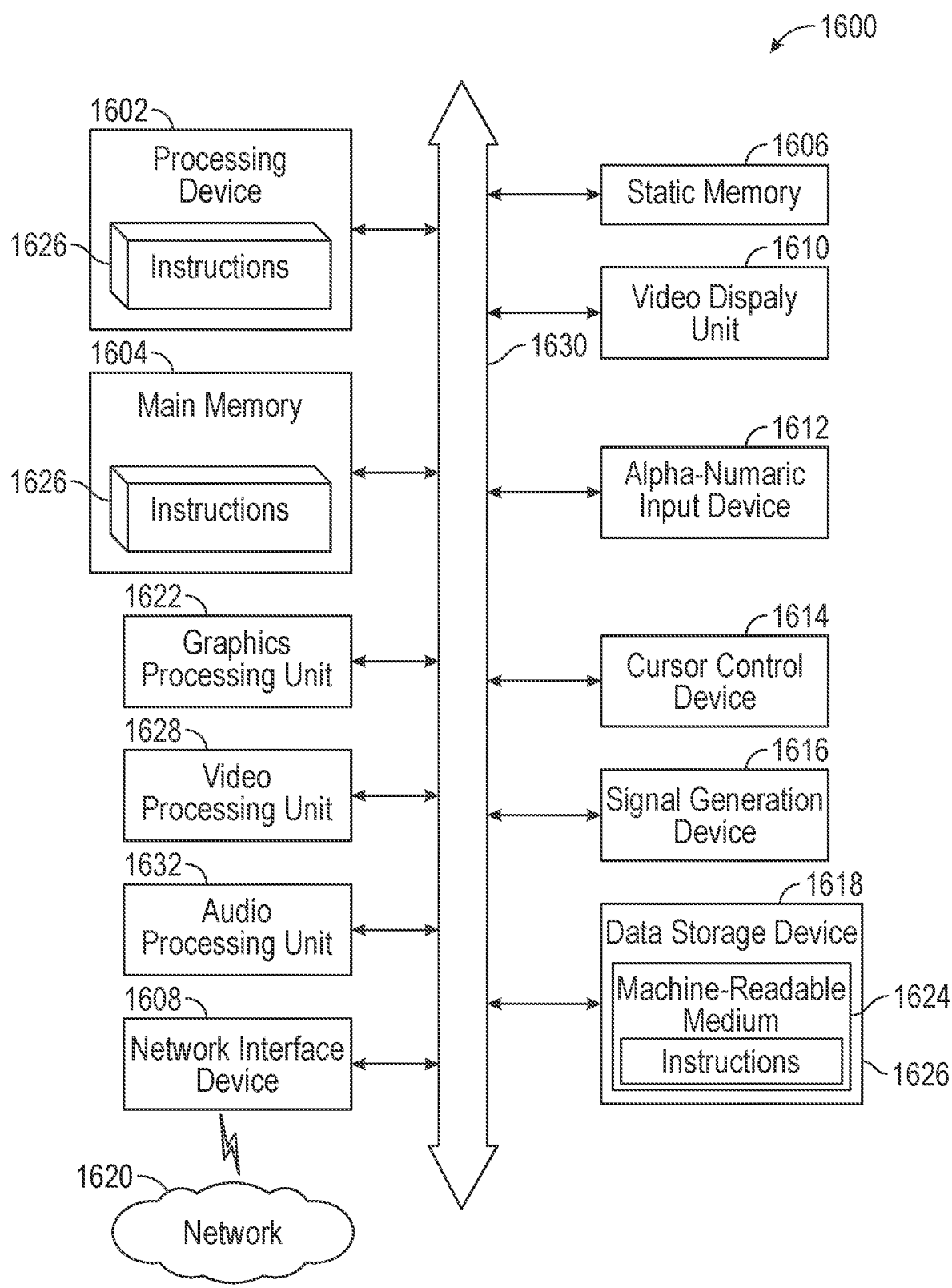
FIG. 16 depicts a diagram of an example computer system in which embodiments of the present disclosure may operate.

The testing device 100 may be configured similar to the computer system 1600 of FIG. 16. For example, the testing device 100 includes a processing device 102, a memory device 104, and interface circuitry 108. In other examples, the testing device 100 includes other elements not illustrated (e.g., one or more elements of computer system 1600 of FIG. 16 not illustrated as being included within the testing device 100).

The processing device 102 may be configured similar to the processing device 1602 of FIG. 16. The memory device 104 is configured similar to the main memory 1604 of FIG. 16, the static memory 1606 of FIG. 16 and/or the machine-readable storage medium 1624 of FIG. 16. The interface circuitry 108 includes outputs test signals to the test circuitries 112 of the superconductive IC device 110 and receives output signals from the test circuitries 112 of the superconductive IC device 110.

The processing device 102 receives (e.g., obtains or accesses) the superconductive circuit design 106 from the memory device 104. In one or more examples, the superconductive circuit design 106 corresponds to the superconductive IC device 110. The superconductive circuit design 106 includes SFQ circuit logic (e.g., Josephson junctions and/or passive elements (e.g., inductors, resistors, transformers, and/or transmission lines)).

As will be described in more detail in the following, the processing device 102 analyzes the nodes within the superconductive circuit design 106 to determine the quantity of test circuitries within the superconductive circuit design 106, the type of test circuitries within the superconductive circuit design 106, and/or the location of test circuitries within the superconductive circuit design 106. The superconductive circuit design 106 is updated to include the test circuitries determined by the processing device 102. The updated superconductive circuit design 107 is generated from the superconductive circuit design 106 to include the test circuitries and is stored within the memory device 104.

The test circuitries 112 include test insertion circuitry, test extraction circuitry, and hybrid test circuitry. The test insertion circuitry receives a test signal and applies the test signal to circuit elements within the corresponding superconductive IC device. The test extraction circuitry outputs an output test signal from circuit elements within the corresponding superconductive IC device. The hybrid test circuitry receives an input test signal and outputs an output test signal from a corresponding superconductive IC device.

Figure 2:
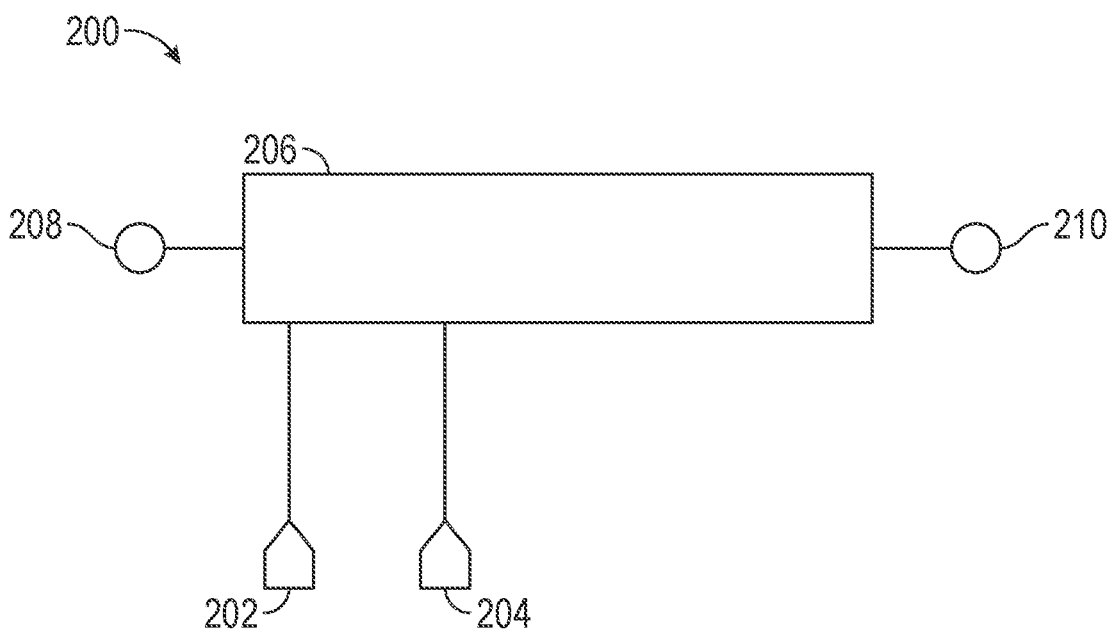
FIG. 2 illustrates a block diagram of test insertion circuitry in accordance with some embodiments of the present disclosure.

FIG. 2 illustrates a block diagram of example test insertion circuitry 200, according to one or more examples. The test insertion circuitry 200 includes a test enable pin 202, a test input pin 204, and test circuitry 206. In one example, the test insertion circuitry 200 is included within the testing circuitries 112 of the superconductive IC device 110. The test insertion circuitry 200 further includes nodes 208 and 210. The nodes 208 and 210 are used to connect the test insertion circuitry 200 within a superconductive circuit design (e.g., the superconductive circuit design 106 of FIG. 1). In one example, the nodes 208 and 210 are connected within a superconductive IC device (e.g., the superconductive IC device 110) such that a signal is received at the node 208 and output via the node 210. In one example, the test insertion circuitry 200 is connected to a wire within a superconductive IC device (e.g., the superconductive IC device 110), and each of the nodes 208 and 210 are connected to the wire.

The test enable pin 202 is used to enable the test circuitry 206. The test input pin 204 is used to receive an input test signal that is applied to the test circuitry 206.

Figure 3:
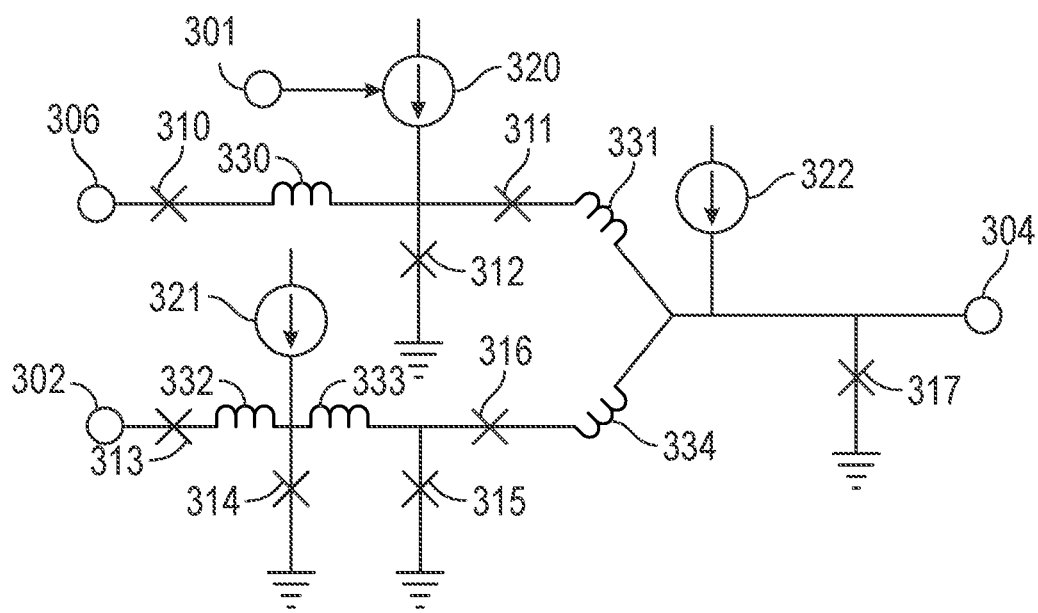
FIG. 3 illustrates a circuit diagram of test insertion circuitry in accordance with some embodiments of the present disclosure.

The test circuitry 206 includes one or more Josephson junctions, inductors, resistors, transformers, and/or transmission lines. In one or more examples, the test circuitry 206 includes one or more current sources and/or current sinks. FIG. 3 illustrates an example circuit diagram of test insertion circuitry 300, according to one or more examples. The test insertion circuitry 300 may be used as the test insertion circuitry 200 of FIG. 2. In other examples, the test insertion circuitry 200 of FIG. 2 may have other configurations. As is illustrated in FIG. 3, the test insertion circuitry 300 functions as a merger circuit that receives a data signal at node 306, a test input signal at the node 302, and outputs a signal via the node 304 based on one of the data signal and the test input signal. In one example, the test insertion circuitry 300 may be referred to as a multiplexer circuit. The node 301 of the test insertion circuitry 300 corresponds to the test enable pin 202 of the test insertion circuitry 200 of FIG. 2. The node 302 of the test insertion circuitry 300 corresponds to the test input pin 204 of the test insertion circuitry 200 of FIG. 2. The node 304 of the test insertion circuitry 300 corresponds to the node 210 of the test insertion circuitry 200 of FIG. 2. Further, the test insertion circuitry 300 receives a data signal via the node 306. The node 306 of the test insertion circuitry 300 corresponds to the node 208 of the test insertion circuitry 200 of FIG. 2. The test insertion circuitry 300 includes Josephson junctions 310-317, current sources 320-322, and inductors 330-334. However, the test insertion circuitry 300 may have a different combination of circuit elements than that illustrated in FIG. 3. In one example, the current source 321 is connected to a node that functions as the test enable pin 202.

The test insertion circuitry 300 selects between an input test signal received at node 302 and a data signal received at node 306. In one example, driving the node 301 with a high voltage value turns the current source 320 on (e.g., the current source 320 is in operation), enabling the test insertion circuitry 300 to select the test signal at node 302, which is output via the node 304. Further, driving the node 301 with a low voltage value turns the current source 320 off, controlling the test insertion circuitry 300 to select a data signal received at the node 306 to be output via the node 304. The current source 320 is used to control when to bypass the data signal received at node 306 to be output via the node 304.

In one example, the Josephson junction 310 is connected to the node 306 and to an input of the inductor 330. The output of the inductor 330 is connected to a node that is connected to the output of the current source 320, the Josephson junction 312, and the Josephson junction 311. The Josephson junction 312 is further connected to a ground voltage node. The Josephson junction 311 is further connected to the inductor 331. The Josephson junction 313 is connected to the node 302 and to the input of the inductor 332. The output of the inductor 332 is connected to a node that is connected to the output of the current source 321, the Josephson junction 314, and the input of the inductor 333. The Josephson junction 314 is further connected to a ground voltage node. The output of the inductor 333 is connected to the Josephson junction 315 and the Josephson junction 316. The Josephson junction 315 is further connected to a ground node, and the Josephson junction 316 is further connected to the input of the inductor 334. The outputs of the inductor 331 and the inductor 334 are connected to each other and to the current source 322, the Josephson junction 317, inductor 334 and the node 304. The Josephson junction 317 is further connected to a ground voltage node. In other examples, the test insertion circuitry 300 may have other configurations that provide the functionality as the circuitry described above.

In one example, the node 306, Josephson junction 310, the inductor 330, the current source 320, the Josephson junction 312, the Josephson junction 311, and the inductor 331 corresponds to a first path, and the node 302, Josephson junction 313, the inductor 332, the current source 321, the Josephson junction 314, the inductor 333, the Josephson junction 315, the Josephson junction 316, and the inductor 334 corresponds to a second path.

Figure 4:
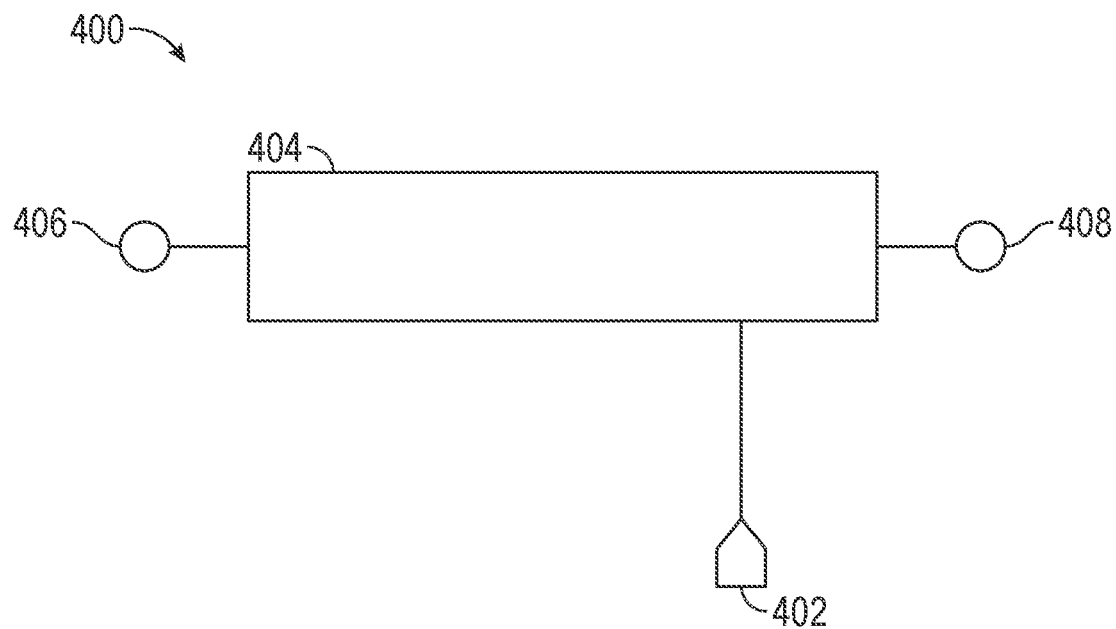
FIG. 4 illustrates a block diagram of test extraction circuitry in accordance with some embodiments of the present disclosure.

FIG. 4 illustrates a block diagram of example test extraction circuitry 400, according to one or more examples. In one example, the test extraction circuitry 400 is included within the testing circuitries 112 of the superconductive IC device 110. The test extraction circuitry 400 includes a test output node 402, test circuitry 404, and nodes 406 and 408. An output test signal is output from the test circuitry 404 via the test output node 402. The nodes 406 and 408 are used to connect the test extraction circuitry 400 within a superconductive circuit design (e.g., the superconductive circuit design 106 of FIG. 1). The nodes 406 and 408 are used to connect the test extraction circuitry 400 within a superconductive circuit design (e.g., the superconductive circuit design 106 of FIG. 1). In one example, the nodes 406 and 408 are connected within a superconductive IC device (e.g., the superconductive IC device 110) such that a signal is received at the node 406 and output via the node 408. In one example, the test extraction circuitry 400 is connected to a wire within a superconductive IC device (e.g., the superconductive IC device 110), and each of the nodes 406 and 408 are connected to the wire. In one example, the test extraction circuitry 400 is included downstream within a superconductive circuit design (e.g., the superconductive circuit design 106 of FIG. 1) from a test insertion circuitry (e.g., the test insertion circuitry 200 of FIG. 2).

Figure 5:
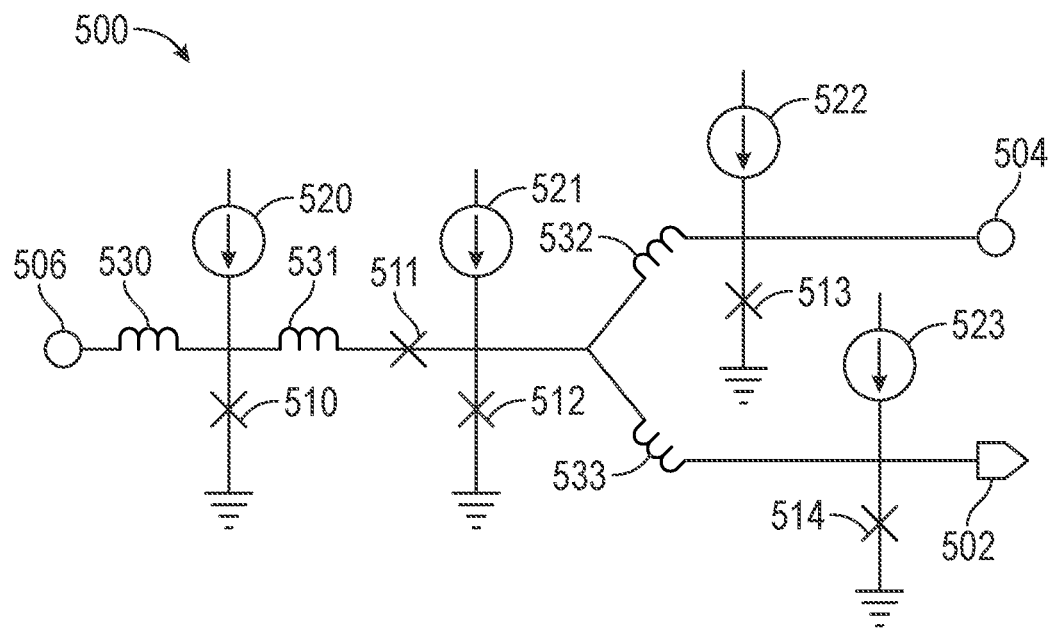
FIG. 5 illustrates a circuit diagram of test extraction circuitry in accordance with some embodiments of the present disclosure.

The test circuitry 404 includes one or more Josephson junctions, inductors, resistors, transformers, and/or transmission lines. In one or more examples, the test circuitry 404 includes one or more current sources and/or current sinks. FIG. 5 illustrates an example circuit diagram of test extraction circuitry 500, according to one or more examples. The test extraction circuitry 500 may be used as the test extraction circuitry 400 of FIG. 4. In other examples, the test extraction circuitry 400 of FIG. 4 may have other configurations. As is illustrated in FIG. 5, the test extraction circuitry 500 functions as a splitter circuit that outputs a test output signal via the node 502, and a data signal via the node 504. A data signal (or other type of signal) is received at the node 506. The test extraction circuitry 500 includes Josephson junctions 510-514, current sources 520-523, and inductors 330-334. However, the test extraction circuitry 500 may have a different combination of circuit elements from that illustrated in FIG. 5.

The test extraction circuitry 500 receives a signal (e.g., a data or test signal) at the node 506, and outputs an output signal (e.g., a data or test signal) via the nodes 504 and 502. In one example, the configuration of the circuit elements of the test extraction circuitry 500 provide the functionality for a signal received at the node 506 to be output via the nodes 502 and 504. In such an example, the signals output via the nodes 502 and 504 are substantially similar to each other.

In one example, the input of the inductor 530 is connected to the node 506, and an output of the inductor 530 is connected to an output of the current source 520, the Josephson junction 510, and an input of the inductor 531. The Josephson junction 510 is further connected to a ground voltage node. The output of the inductor 531 is connected to the Josephson junction 511. The Josephson junction 511 is connected to the output of the current source 521, the Josephson junction 512, the input of the inductor 532 and the input of the inductor 533. The Josephson junction 512 is further connected to a ground voltage node. The output of the inductor 532 is connected to the output of the current source 522, and the Josephson junction 513, and the node 504. The output of the inductor 533 is connected to the output of the current source 523, and the Josephson junction 514, and the node 502.

In one example, the inductor 532, the current source 522, the Josephson junction 513 and the node 504 corresponds to a first path, and the inductor 533, the current source 523, the Josephson junction 514 and the node 502 corresponds to a second path.

In other examples, the test extraction circuitry 500 may have other configurations that provide the functionality as the circuitry described above.

Figure 6:
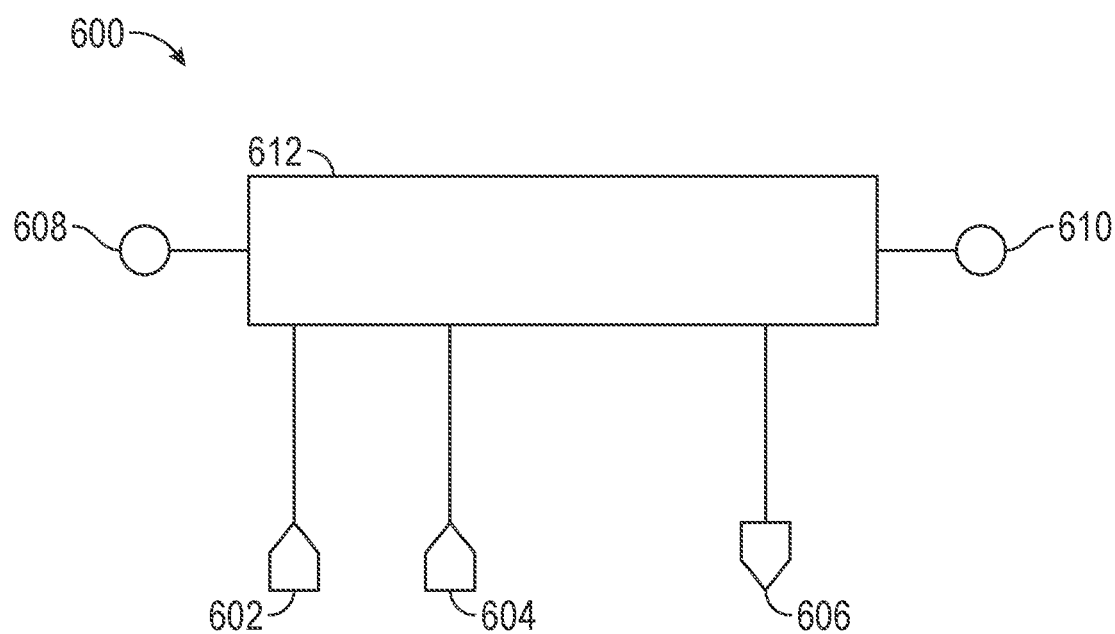
FIG. 6 illustrates a block diagram of hybrid test circuitry in accordance with some embodiments of the present disclosure.

FIG. 6 illustrates a block diagram of example hybrid test circuitry 600, according to one or more examples. In one example, the hybrid test circuitry 600 is included within the testing circuitries 112 of the superconductive IC device 110. The hybrid test circuitry 600 functions as both test insertion circuitry and text extraction circuitry. The hybrid test circuitry 600 includes a test enable pin 602, a test input pin 604, test output pin 606, nodes 608 and 610 and test circuitry 612. The test enable pin 602 receives an enable signal that enables the test circuitry 612. The test input pin 604 receives a test input signal that is applied to the test circuitry 612. The test output pin 606 outputs a test output signal from the test circuitry 612. The nodes 608 and 610 are used to connect the hybrid test circuitry 600 within a superconductive circuit design (e.g., the superconductive circuit design 106 of FIG. 1). The nodes 608 and 610 are used to connect the hybrid test circuitry 600 within a superconductive circuit design (e.g., the superconductive circuit design 106 of FIG. 1). In one example, the nodes 608 and 610 are connected within a superconductive IC device (e.g., the superconductive IC device 110) such that a signal is received at the node 608 and output via the node 610. In one example, the hybrid test circuitry 600 is connected to a wire within a superconductive IC device (e.g., the superconductive IC device 110), and each of the nodes 608 and 610 are connected to the wire.

Figure 7:
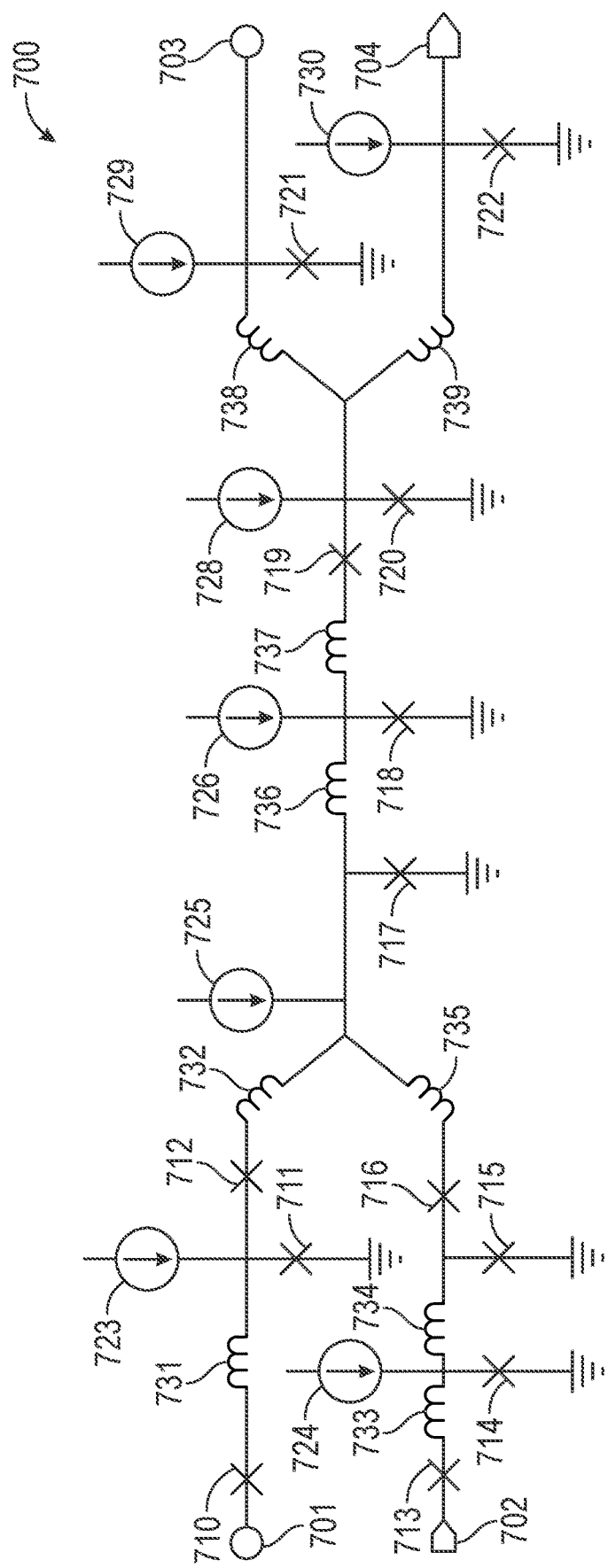
FIG. 7 illustrates a circuit diagram of hybrid test circuitry in accordance with some embodiments of the present disclosure.

The test circuitry 612 includes one or more Josephson junctions, inductors, resistors, transformers, and/or transmission lines. In one or more examples, the test circuitry 612 includes one or more current sources and/or current sinks. FIG. 7 illustrates an example circuit diagram of hybrid test circuitry 700, according to one or more examples. The hybrid test circuitry 700 may be used as the hybrid test circuitry 600 of FIG. 6. In other examples, the hybrid test circuitry 600 of FIG. 6 may have other configurations. As is illustrated in FIG. 7, the hybrid test circuitry 700 functions as a merger circuit (or multiplexer circuit) and a splitter circuit that receives a test input signal and outputs a test output signal via the nodes 702 and 704 respectively. The node 702 corresponds to the test input pin 604 of the hybrid test circuitry 600 of FIG. 6, and the node 704 corresponds to the test output pin 606 of the hybrid test circuitry 600 of FIG. 6. Further, the node 701 corresponds to the node 608 of the hybrid test circuitry 600 of FIG. 6 and the node 703 corresponds to the node 610 of the hybrid test circuitry 600 of FIG. 6. The hybrid test circuitry 700 includes Josephson junctions 710-722, current sources 723-730, and inductors 731-739. However, the hybrid test circuitry 700 may have a different combination of circuit elements than that illustrated in FIG. 7. In one example, the current source 723 or 724 is connected an input node that functions as the test enable pin 602.

In one example, the hybrid test circuitry 700 selects between an input test signal received at the node 702 and a data signal received at the node 701. The current source 724 enables the hybrid test circuitry 700 to select the test signal at node 702, which is output via the output via the nodes 703 and 704. Further, the current source 724 controls the hybrid test circuitry 700 to select a data signal received at the node 70 to be output via the nodes 703 and 704. In one example, the configuration of the circuit elements of the hybrid test circuitry 700 provide the functionality for a signal received at the node 701 or 702 to be output via the nodes 703 and 704. In such an example, the signals output via the nodes 703 and 704 are substantially similar to each other.

With further reference to FIG. 1, determining the quantity of, the type of, and/or location of test circuits within the superconductive circuit design 106, includes inserting the test insertion circuitry 200, the test extraction circuitry 400, and/or the hybrid test circuitry 600 at different nodes within the superconductive circuit design 106, and determining one or more of a corresponding testability characteristic and a circuit overhead characteristic. The testability characteristic includes one or more of a controllability characteristic and an observability characteristic. A controllability characteristic corresponds to the level to control internal nodes within the superconductive circuit design 106 to control test generation within the superconductive circuit design 106. The controllability characteristic may have a value of zero or more. In one example, a lower value for the controllability characteristic indicates a greater level to control internal nodes within the superconductive circuit design 106.

An observability characteristic corresponds to the level to observe an internal node of the superconductive circuit design 106. The observability characteristic may have a value of zero or more. In one example, a lower value for the observability characteristic indicates a greater level to observe internal nodes within the superconductive circuit design 106.

The circuit overhead characteristic corresponds to how the test circuitry (e.g., the test insertion circuitry 200, the test extraction circuitry 400, and/or the hybrid test circuitry 600) affects the power properties of the superconductive circuit design 106, the delay of the superconductive circuit design 106, and circuit area of the superconductive circuit design 106.

In one example, as is described in greater detail in the following, a test circuitry (e.g., the test insertion circuitry 200, the test extraction circuitry 400, and/or the hybrid test circuitry 600) is iteratively inserted and analyzed at the nodes within the superconductive circuit design 106 to determine the corresponding testability characteristics. The circuit overhead characteristics may be predetermined and stored within the memory device 104 or determined by the processing device 102 for each of the test circuitries and stored within the memory device. For example, the processing device 102 determines the circuit overhead characteristics for the test circuitries based on the properties of each circuit logic element used to form the test circuitries.

As is described in greater detail in the following, the processing device 102 determines the quantity of each test circuitry to include within the superconductive circuit design 106 and the location to insert the test circuitry or circuitries within the superconductive circuit design 106 based on the testability characteristics and circuit overhead characteristics. For example, the type and location of test circuitry that provides testability characteristics that are less than a corresponding threshold value and also have a circuit overhead characteristic that is less than an overhead threshold.

Figure 8:
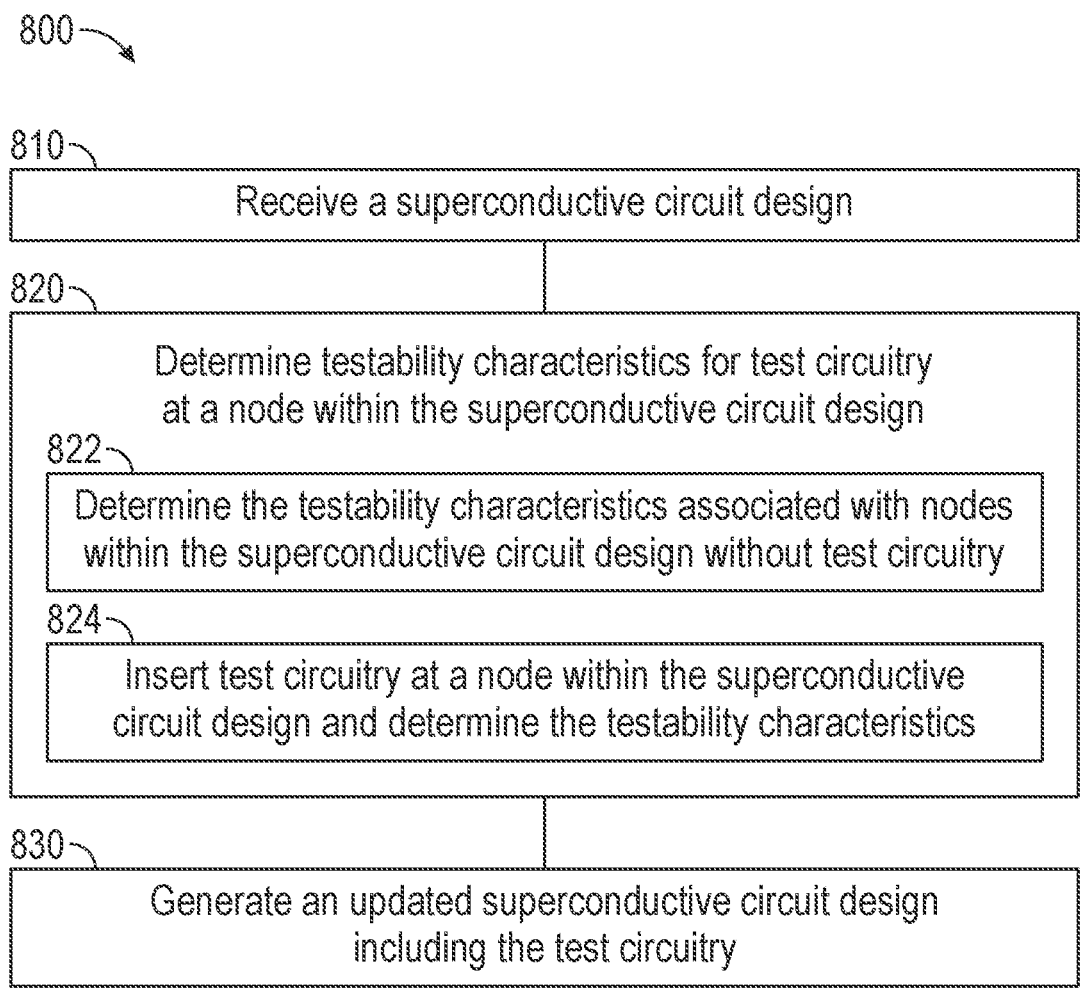
FIG. 8 illustrates a flowchart of a method for inserting test circuitry within a superconductive circuit design in accordance with some embodiments of the present disclosure.

FIG. 8 illustrates a flowchart of the method 800 for generating an updated circuit design having one or more test circuitries. The method 800 is performed by the testing device 100. For example, the processing device 102 executes instructions (e.g., instructions 1626 of FIG. 16) stored within the memory device 104 to perform the method 800. In one example, the method 800 is performed as part of synthesis and design for test 1518 of FIG. 15.

At 810, a superconductive circuit design is received. For example, the processing device receives (e.g., obtains or accesses) the superconductive circuit design 106 from the memory device 104. In one example, receiving the superconductive circuit design 106 includes receiving the netlist of the superconductive circuit design 106.

At 820, a testability characteristic and a circuit overhead characteristic for test circuitry is determined for a test circuity at a first node within the superconductive circuit design. For example, the processing device 102 inserts test circuitry (e.g., the test insertion circuitry 200, the test extraction circuitry 400, or the hybrid test circuitry 600) at a first node within the superconductive circuit design 106, and determines one or more testability characteristics for the test circuitry.

In one example, the processing device 102 uses a Sandia controllability observability analysis program (SCOAP) to determine the testability characteristic(s) of the test circuitry at a node within the superconductive circuit design 106. SCOAP is used to analyze and define measures in the difficulty in controlling and observing the logical value of internal nodes from inputs to outputs of a superconductive circuit design. In one example, the measures are determined via a function of the type of logic gate, the location of the internal node, and/or circuit complexity, among others. In other examples, other methods may be used to determine the testability characteristics. In one example, the testability characteristic is determined by analyzing and quantifying the difficulty to control or observe internal nodes within the superconductive circuit design 106. In one example, the testability characteristic of test circuitry is determined according to a combinational controllability of zero value (CC0), which describes the difficulty level to set an internal node to logic 0. A combinational controllability of one value (CC1) corresponds to the difficulty level of setting an internal node to logic 1. A combinational observability value (CO) corresponds to the difficulty level in observing an internal node. The CC0 and CC1 have a value of about one or more. In other examples, the CC0 and CC1 may have values less than one. The CO has a value of about 0 or more. In one example, higher values of CC0, CC1, and CO indicate greater difficulty in controlling or observing an internal node.

Figure 9:
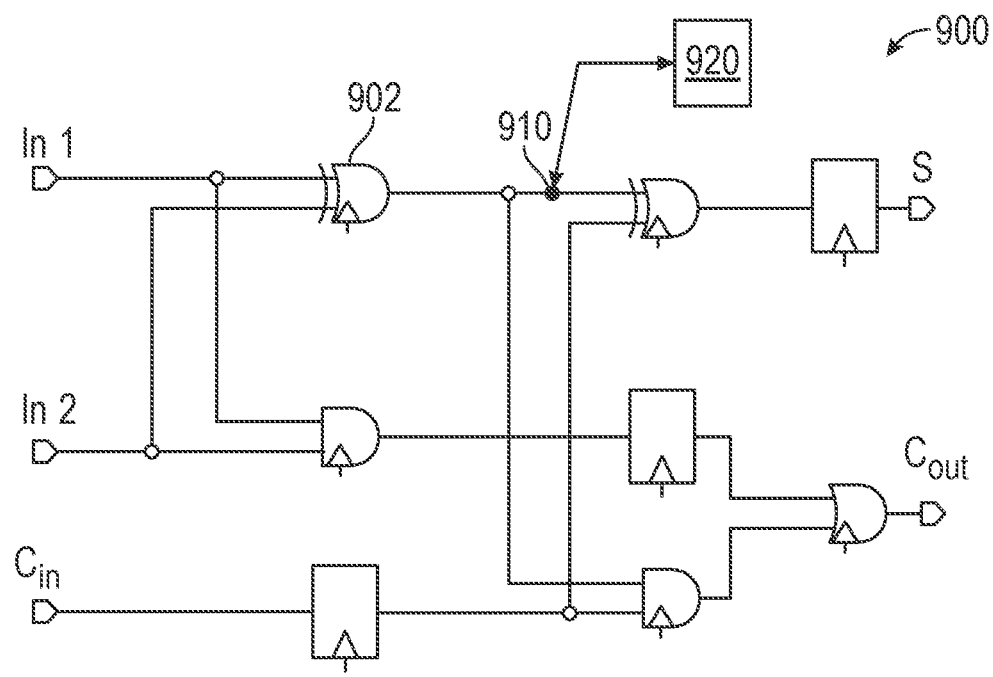
FIG. 9 illustrates a circuit diagram of a circuit without test circuitry in accordance with some embodiments of the present disclosure.
Figure 10:
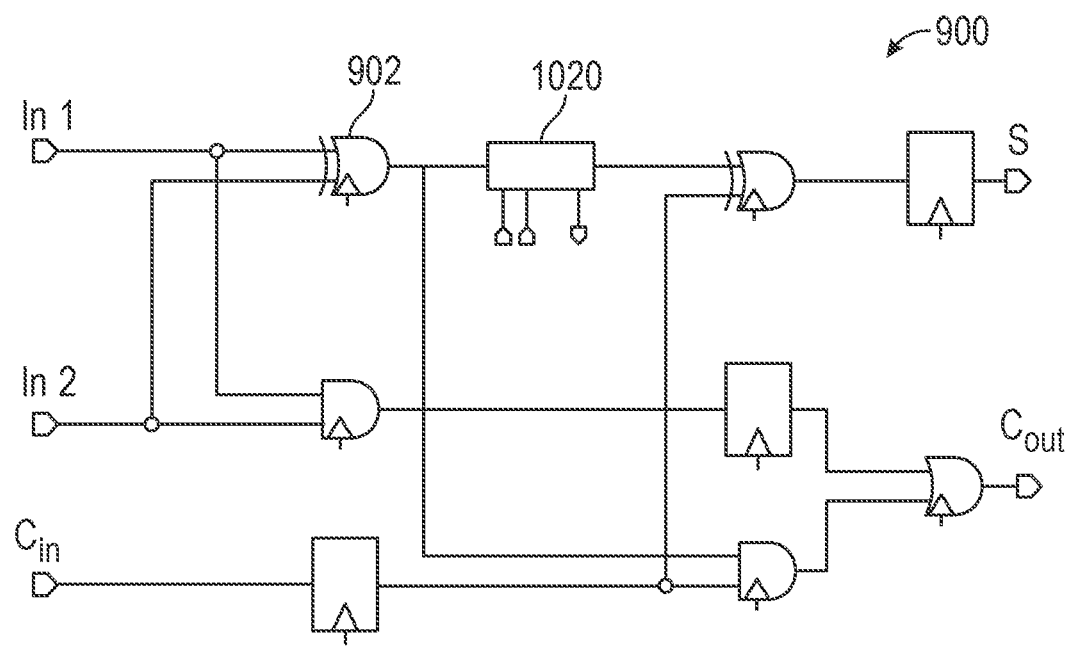
FIG. 10 illustrates the circuit diagram of FIG. 9 with test circuitry in accordance with some embodiments of the present disclosure.

FIG. 9 illustrates the superconductive circuit 900. In the superconductive circuit 900, test circuitry 920 is inserted at node 910. The node 910 (and the output of the XOR circuitry 902) is being observed and/or controlled via the test circuitry 920. In FIG. 10, the superconductive circuit 900 includes hybrid test circuitry 1020 inserted at the output of the XOR circuitry 902. In one example, the processing device 102 determines the testability characteristics of the internal nodes before and after inserting test circuitry. For example, with reference to FIG. 9, the testability characteristics of the internal node 910 are measured without the hybrid test circuitry 1020 being inserted and also measured with the hybrid test circuitry 1020 being inserted.

Figure 11:
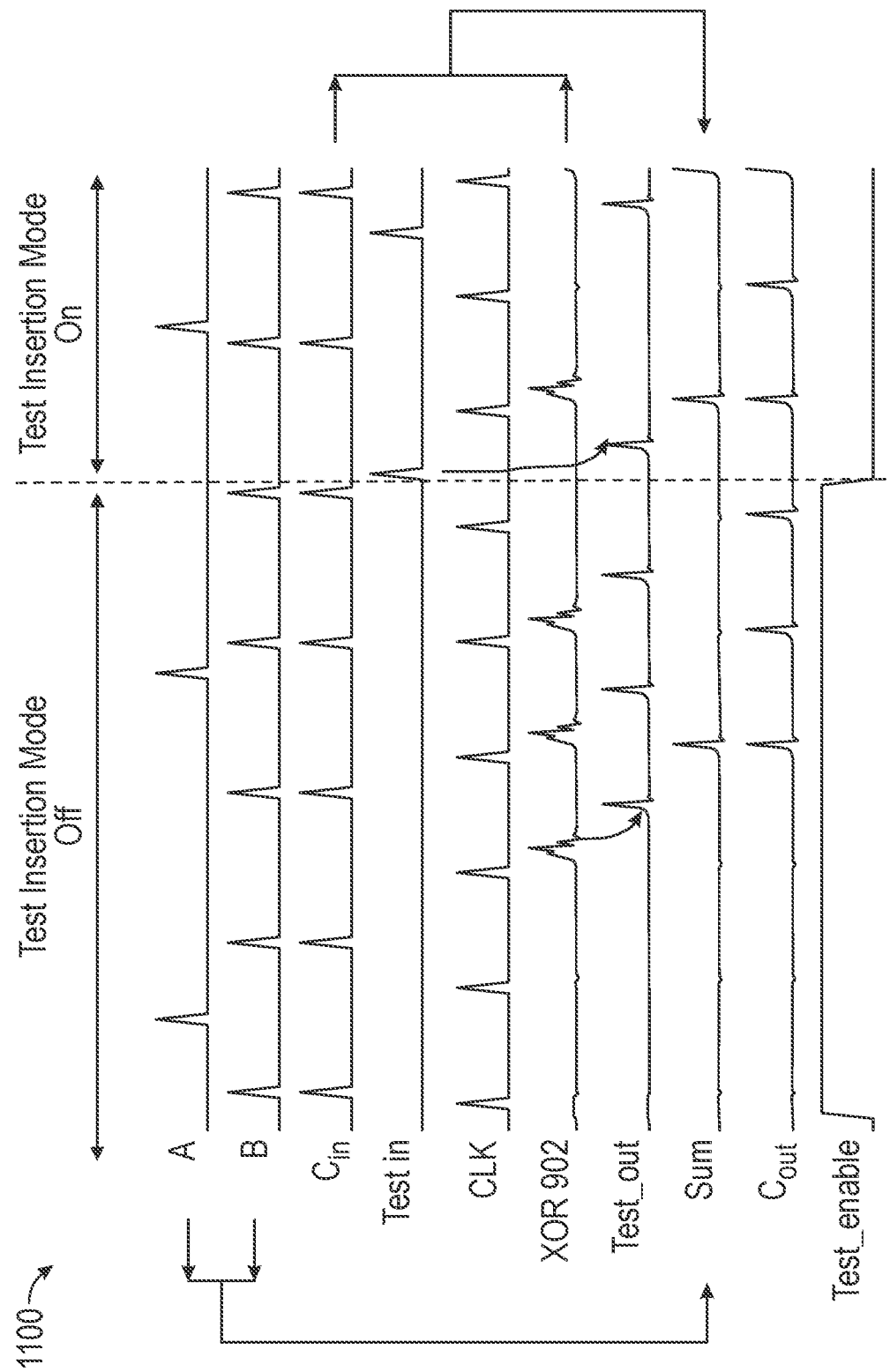
FIG. 11 illustrates signal waveforms of the circuit diagram of FIG. 10 in accordance with some embodiments of the present disclosure.

FIG. 11 illustrates waveforms 1100 generated by the operation of superconductive circuit 900 including the hybrid test circuitry 1020 located at the output node of the XOR circuitry 902. The superconductive circuit 900 functions as a full adder. The hybrid test circuitry 1020 operates as both test insertion circuitry and test extraction circuitry, with two modes of operation. As illustrated in FIG. 11, in the mode "Test insertion mode off," the signal at the output node of the XOR 902 (the input to the hybrid test circuitry 1020) is produced at the output. In this case, the Sum output is the sum operation of the A and B signals. In one example, the A and B signals are the input signal and may be referred to as In1 and In2 similarly as used and illustrated with regard to FIG. 9. In the mode "Test insertion mode on," the Test_in signal is passed to the output of the hybrid test circuitry 1020. Accordingly, the Sum output is the XOR operation of the Test_in signal and the $C_{in}$ signal. In one example, the logical values of the input signals A and B are summed in binary formatting (e.g., 0+1=01, 1+1=10, where the right side digit is sum (S), and the left side digits is carry out (Cout)). The Test out signal is a real-time copy of the output of the hybrid test circuitry 1020. The Test enable signal switches the hybrid test circuitry 1020 between the "Test insertion mode off" mode and the "Test insertion mode on" mode. The Test_in signal and Test enable signals are provided by a test device (e.g., the test device 100 of FIG. 1).

Figure 12A:
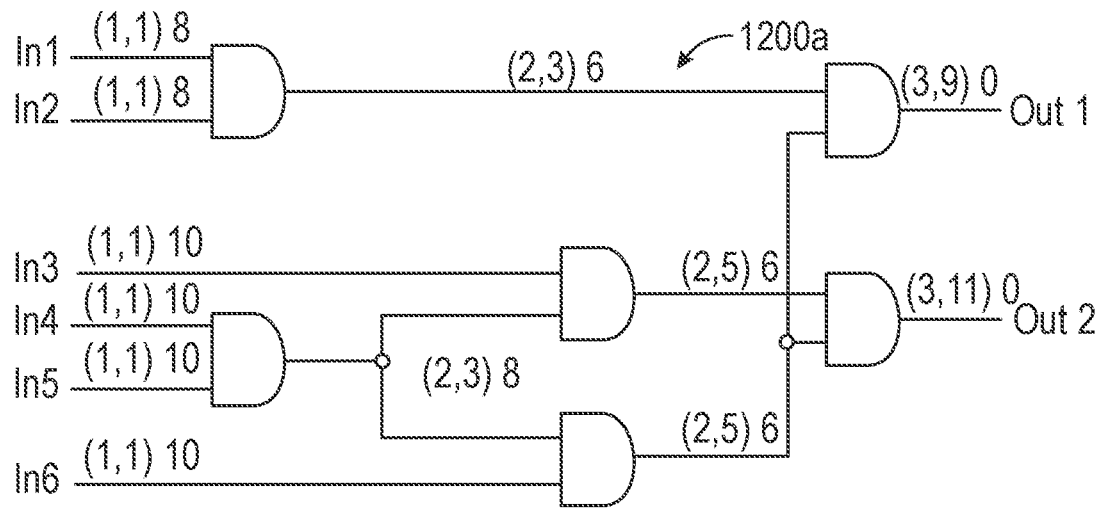
FIG. 12A illustrates a circuit diagram of a circuit without test circuitry in accordance with some embodiments of the present disclosure.
Figure 12B:
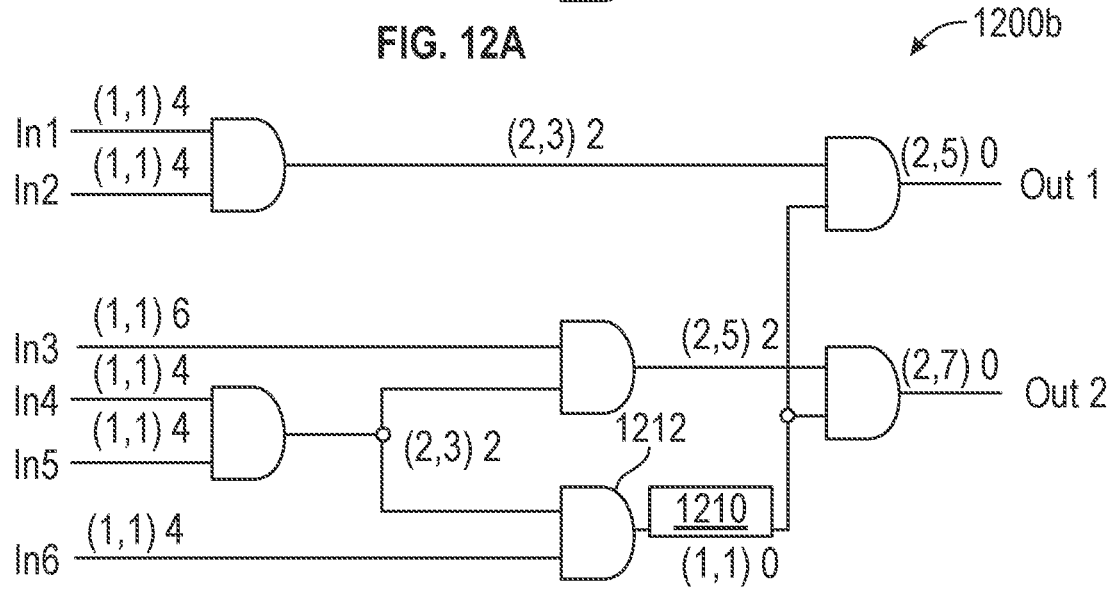
FIG. 12B illustrates the circuit diagram of FIG. 12A with test circuitry inserted at a first node in accordance with some embodiments of the present disclosure.
Figure 12C:
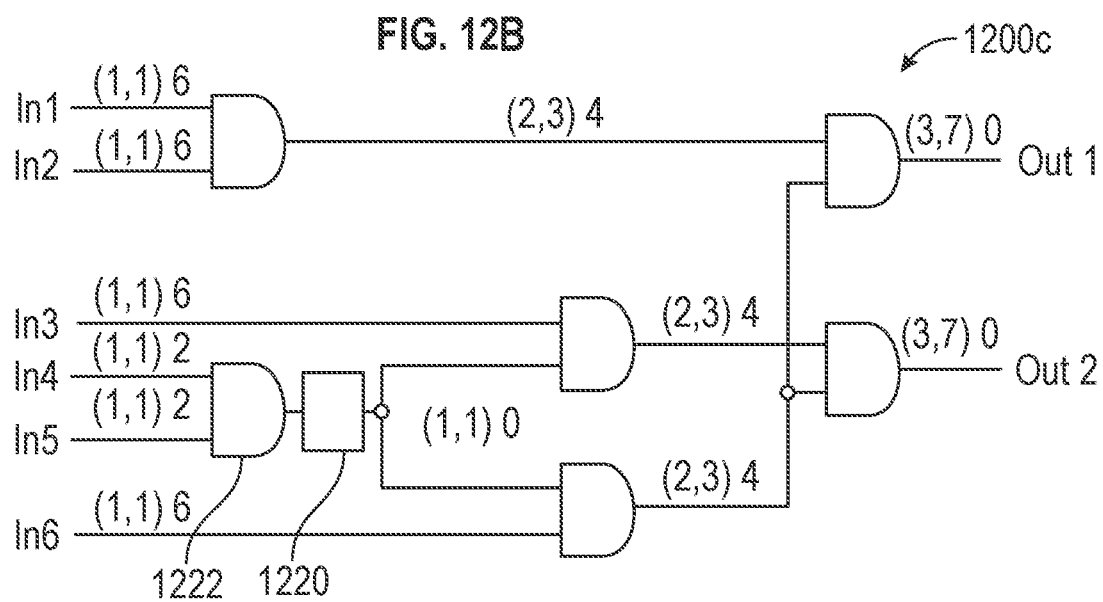
FIG. 12C illustrates the circuit diagram of FIG. 12A with test circuitry inserted at a second node in accordance with some embodiments of the present disclosure.

FIGS. 12A, 12B, and 12C illustrate three different stages of the superconductive circuit design 1200. The FIG. 12A illustrates the superconductive circuitry 1200a that does not include test circuitry. The FIG. 12B illustrates the superconductive circuitry 1200b with test circuitry 1210 inserted (e.g., included) at the output of the AND gate 1212. The FIG. 12C illustrates the superconductive circuitry 1200b with test circuitry 1220 inserted (e.g., included) at the output of the AND gate 1222. The test circuitry 1210 and the test circuitry 1220 may be the same type or different types of test circuitries. The test circuitry 1210 and the test circuitry 1220 are each one of the test insertion circuitry 200 of FIG. 2, the test extraction circuitry 400 of FIG. 4, and the hybrid test circuitry 600 of FIG. 6. The processing device 102 analyzes the nodes of the superconductive circuitries 1200a, 1200b, and 1200c to determine the testability characteristics for each of the superconductive circuitries 1200a, 1200b, and 1200c.

With further reference to FIG. 8, determining the testability characteristics circuit overhead characteristic for test circuitry at a node at 820 includes 822, determining the testability characteristics associated with nodes within the superconductive circuit design without test circuitry being included within the superconductive circuit design. In one example, the processing device 102 determines testability characteristics associated with nodes within the superconductive circuit design 106 without test circuitry being included within the superconductive circuit design 106. In one example, the processing device 102 determines the fanout size for each node. The fanout corresponds to the number of traces (or wires) connected to the output of a node. In one example, the processing device 102 determines the nodes having a fanout size above a threshold. In another example, the processing device 102 determines nodes having a desired (e.g., the largest) fanout size.

In one or more examples, determining the testability characteristics for test circuitry at a node includes inserting test circuitry at a node within the superconductive circuit design and determining the testability characteristics of 824. In one example, the process device 102 selects the nodes having a fanout that greater than a threshold, or the N nodes determined to have the largest fanouts. N is one or more. The processing device 102 inserts a first test circuitry at a first node and determines the testability characteristics for the test circuitry at the first node. In one example, the first node is a first one of the selected nodes.

In one or more examples, the processing device 102 iteratively inserts test insertion circuitry at each node (e.g., each node of the superconductive circuit design 106 or each node of the selected nodes) and determines corresponding testability characteristics for each test insertion circuitry and node pair. Further, the processing device 102 iteratively places test extraction circuitry at each node (e.g., each node of the superconductive circuit design 106 or each node of the selected nodes) and determines corresponding testability characteristics for each test extraction circuitry and node pair. The processing device 102 iteratively places hybrid test circuitry at each node (e.g., each node of the superconductive circuit design 106 or each node of the selected nodes) and determines corresponding testability characteristics for each hybrid test circuitry and node pair. Accordingly, at each node (e.g., each node of the superconductive circuit design 106 or each node of the selected nodes) within the superconductive circuit design, the testability characteristics for each type of test circuitry (e.g., the test insertion circuitry, the test extraction circuitry, and/or hybrid test circuitry) are determined.

In one example, the processing device 102 further determines the nodes to insert test circuitry based on the testability characteristics determined for the nodes of the superconductive circuit design 106 without test circuits being inserted within the superconductive circuit design 106. For example, the node or nodes associated with a testability characteristic that is less than a threshold value are selected. In another example, the node or nodes associated with a testability characteristic that is greater than a threshold value are selected.

With reference to FIGS. 12A, 12B, and 12C, the processing device 102 selects the output node of the AND gate 1212 and the output node of the AND gate 1222 as the nodes to insert test circuitry based on the corresponding testability characteristics. For example, the output node of the AND gate 1212 and the output node of the AND gate 1222 are determined to have the testability characteristics above a threshold value and/or higher than that of the other nodes within the superconductive circuit design 1200. Further, the output node of the AND gate 1212 and the output node of the AND gate 1222 are determined to have a fanout that is higher than the other nodes within the superconductive circuit design 1200. Each type of test circuitry (e.g., the test insertion circuitry 200 of FIG. 2, the test extraction circuitry 400 of FIG. 4, or the hybrid test circuitry 600 of FIG. 6) is inserted into the selected nodes, and the corresponding testability characteristics are determined.

Figure 13:
FIG. 13 illustrates a table of testability characteristics in accordance with some embodiments of the present disclosure.

Each test circuitry influences the testability characteristics at a node differently (e.g., a different affect to the power, area, and/or delay overhead). The table 1300 of FIG. 13 illustrates the testability characteristics CC0, CC1, CO, and the CC0 for all nodes (e.g., ΣCC0), the CC1 for all nodes (e.g., ΣCC1), and the CO for all nodes (e.g., ΣCO).

As is illustrated in the table 1300, CC0 is not improved by inserting in test extraction circuitry, and CC0 is improved by inserting test insertion circuitry and hybrid test circuitry. Further, CC1 is not improved by inserting in test extraction circuitry, and CC0 is improved by inserting test insertion circuitry and hybrid test circuitry. CO is not improved by inserting in test extraction circuitry or test insertion circuitry, and CC1 is improved by inserting hybrid test circuitry. Further, the test extraction circuitry does not improve ΣCC0 or ΣCC1, and does improve ΣCO. The test insertion circuitry improves ΣCC0, ΣCC1, and ΣCO. The hybrid test circuitry improves ΣCC0, ΣCC1, and ΣCO.

Figure 14:
FIG. 14 illustrates a table of circuit overhead characteristics in accordance with some embodiments of the present disclosure.

The table 1400 of FIG. 14 illustrates the circuit overhead parameters for the test circuitries (e.g., the test insertion circuitry 200 of FIG. 2, the test extraction circuitry 400 of FIG. 4, or the hybrid test circuitry 600 of FIG. 6). The circuit overhead parameters are predetermined and/or determined by the processing device 102 for each type of test circuitry. SFQ logic gates are clocked and latched. Further, several clock cycles are used to produce an output from each logic stage between sequentially-adjacent registers. In one example, the extraction circuitry has no effect on the speed of the corresponding superconductive circuit as long as $T_{Delay}+T_{Combinational}<T$. $T_{Delay}$ is the delay of the test extraction circuitry, $T_{Combinational}$ is the delay of the circuitry between the two registers/logic cells within the superconductive circuit and connected to the test extraction circuitry, and T is the clock period. In one example, the detection time of the test extraction circuitry is about 7 ps. In other examples, the detection time of the test extraction circuitry is greater than or less than 7 ps. The detection time of the hybrid test circuitry is 18 ps. In other examples, the detection time of the hybrid test circuitry is greater than or less than 18 ps.

The table 1400 further indicates that the area overhead (e.g., circuit area overhead) for the test extraction circuitry includes five Josephson junctions (JJ), four inductors (L), and four resistors (R). The area overhead (e.g., circuit area overhead) for the test insertion circuitry includes eight Josephson junctions (JJ), five inductors (L), and three resistors (R). The area overhead (e.g., circuit area overhead) for the hybrid test circuitry includes thirteen Josephson junctions (JJ), nine inductors (L), and seven resistors (R).

The test extraction circuitry has a power overhead of 0.513 fW/calculation. The test insertion circuitry has a power overhead 0.275 fW/calculation in a normal mode, and a power overhead of 0.275 fW/calculation in a test mode. The hybrid test circuitry has a power overhead of 0.788 fW/calculation in a normal mode and a power overhead of 0.78 fW/calculation in a test mode. The power overhead is for a 10 KA/cm2 process technology. In other process technologies, the power overhead may be smaller or larger.

In one or more examples, the structure of the superconductive circuit under test is used to determine the influence of inserting a test circuitry (e.g., the test insertion circuitry 200 of FIG. 2, the test extraction circuitry 400 of FIG. 4, or the hybrid test circuitry 600 of FIG. 6). Further, as can be seen from table 1300 and table 1400, the number of nodes, number of logic gates, the number of logic levels from the primary inputs (for controllability) or primary outputs (for observability), and fanout of each internal node, determine whether inserting a test circuitry improves the DFT of the superconductive circuit design.

At 830, an updated superconductive circuit design is generated that includes the test circuitry. For example, the processing device 102 generates the updated superconductive circuit design 107. The updated superconductive circuit design 107 includes one or more test circuitries (e.g., one or more of the test insertion circuitries 200 of FIG. 2, one or more of the test extraction circuitries 400 of FIG. 4, and/or one or more of the hybrid test circuitries 600 of FIG. 6). In one example, the processing device 102 determines the quantity of each type of test circuitry, and the location of the test circuitries within the superconductive circuit design 106 based on the testability characteristics and circuit overhead characteristics. The processing device 102 determines the type of test circuitry or circuitries, the location of test circuitry or circuitries, and quantity of test circuitry or circuitries to include within the superconductive circuit design based on the testability characteristics and overhead parameters. For example, the processing device 102 determines a type of test circuitry and a location of test circuitry that are associated with testing characteristics that are below a first threshold value and that are associated with overhead parameters that are below a second threshold. In one example, the processing device analyzes the testing characteristics stored within the memory device 104 for each of the test circuitries at each tested node within the superconductive circuit design 106, and the overhead parameters stored within the memory device 104 to determine the test circuitry type or types and the nodes to insert the test circuitries within the superconductive circuit design 106 to generate the updated superconductive circuit design 107. The updated superconductive circuit design 107 is stored in the memory device 104. In one example, the test circuitry type and a corresponding node pair associated with test characteristics below a threshold level, and a test circuitry type having overheard characteristics below a threshold level are determined and used to generate the updated superconductive circuit design 107 from the superconductive circuit design 106.

Figure 15:
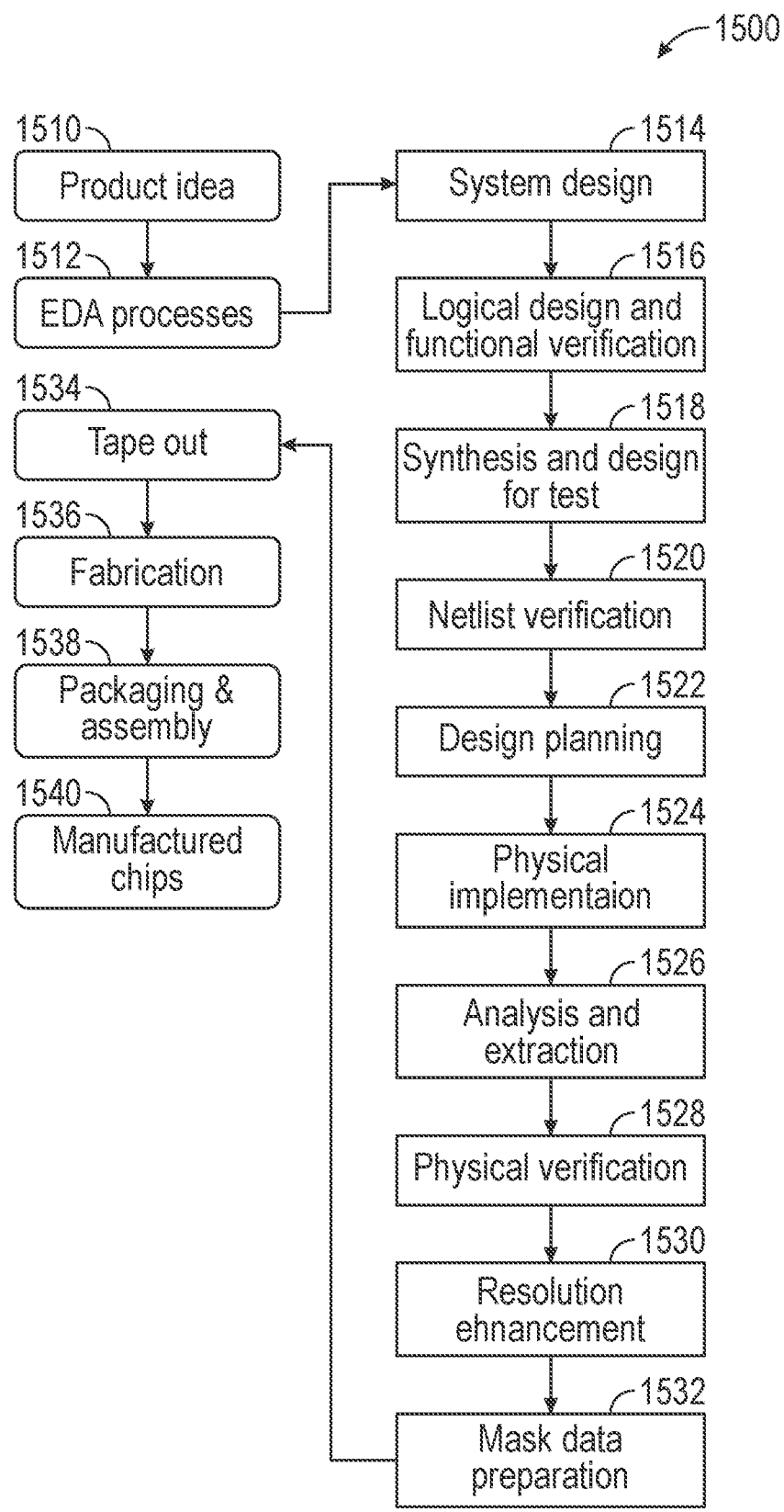
FIG. 15 depicts a flowchart of various processes used during the design and manufacture of an integrated circuit in accordance with some embodiments of the present disclosure.

FIG. 15 illustrates an example set of processes 1500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1510 with information supplied by a designer, information which is transformed to create an article of manufacture that uses a set of EDA processes 1512. When the design is finalized, the design is taped-out 1534, which is when artwork (e.g., geometric patterns) for the integrated circuit is sent to a fabrication facility to manufacture the mask set, which is then used to manufacture the integrated circuit. After tape-out, a semiconductor die is fabricated 1536 and packaging and assembly processes 1538 are performed to produce the finished integrated circuit 1540.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 15. The processes described by be enabled by EDA products (or EDA systems).

During system design 1514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1520, the netlist is checked for compliance with timing constraints and for correspondence with the HDL code. During design planning 1522, an overall floor plan for the integrated circuit is constructed and analyzed for timing and top-level routing.

During layout or physical implementation 1524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1526, the circuit function is verified at the layout level, which permits refinement of the layout design. During physical verification 1528, the layout design is checked to ensure that manufacturing constraints are correct, such as DRC constraints, electrical constraints, lithographic constraints, and that circuitry function matches the HDL design specification. During resolution enhancement 1530, the geometry of the layout is transformed to improve how the circuit design is manufactured.

During tape-out, data is created to be used (after lithographic enhancements are applied if appropriate) for production of lithography masks. During mask data preparation 1532, the 'tape-out' data is used to produce lithography masks that are used to produce finished integrated circuits.

A storage subsystem of a computer system (such as computer system 1600 of FIG. 16,) may be used to store the programs and data structures that are used by some or all of the EDA products described herein, and products used for development of cells for the library and for physical and logical design that use the library.

FIG. 16 illustrates an example machine of a computer system 1600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM), a static memory 1606 (e.g., flash memory, static random access memory (SRAM), etc.), and a data storage device 1618, which communicate with each other via a bus 1630.

Processing device 1602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. The processing device 1602 may be configured to execute instructions 1626 for performing the operations and steps described herein.

The computer system 1600 may further include a network interface device 1608 to communicate over the network 1620. The computer system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), a graphics processing unit 1622, a signal generation device 1616 (e.g., a speaker), graphics processing unit 1622, video processing unit 1628, and audio processing unit 1632.

The data storage device 1618 may include a machine-readable storage medium 1624 (also known as a non-transitory computer-readable medium) on which is stored one or more sets of instructions 1626 or software embodying any one or more of the methodologies or functions described herein. The instructions 1626 may also reside, completely or at least partially, within the main memory 1604 and/or within the processing device 1602 during execution thereof by the computer system 1600, the main memory 1604 and the processing device 1602 also constituting machine-readable storage media.

In some implementations, the instructions 1626 include instructions to implement functionality corresponding to the present disclosure. While the machine-readable storage medium 1624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving a superconductive circuit design comprising superconductive logic elements;
   determining, via a processing device, a first testability characteristic for first test circuitry at a first node within the superconductive circuit design, wherein the first testability characteristic corresponds to one or more of a test generation control level and a test observability control level;
   generating an updated superconductive circuit design from the superconductive circuit design based on the first testability characteristic for the first test circuitry, wherein the updated superconductive circuit design includes the first test circuitry at the first node; and
   outputting the updated superconductive circuit design to a device, wherein the first test circuitry of the updated superconductive circuit design is used to detect one or more of a fault and a defect within the updated superconductive circuit design.

2. The method of claim 1, wherein the first test circuitry is one or more of test insertion circuitry configured to receive a test signal and test extraction circuitry configured to output a test output signal.

3. The method of claim 1, further comprising:
   determining a second testability characteristic for a second test circuitry at the first node within the superconductive circuit design, wherein a type of the first test circuitry differs from a type of the second test circuitry.

4. The method of claim 3 further comprising:
   wherein generating the updated superconductive circuit design to include the first test circuitry includes selecting the first test circuitry based on a comparison of the first testability characteristic and the second testability characteristic.

5. The method of claim 1, wherein generating the updated superconductive circuit design to include the first test circuitry at the first node based on the first testability characteristic comprises determining that the first testability characteristic is less than a first threshold value.

6. The method of claim 1, wherein generating the updated superconductive circuit design to include the first test circuitry is further based on a first overhead characteristic of the first test circuitry being less than a second threshold value.

7. The method of claim 6, wherein the first overhead characteristic corresponds to one or more of circuit area, power dissipation, detection time, and processing delay.

8. A non-transitory computer readable medium comprising stored instructions, which when executed by a processor, cause the processor to:
receive a superconductive circuit design comprising superconductive logic elements;
determine a first testability characteristic for first test circuitry at a first node within the superconductive circuit design, wherein the first testability characteristic corresponds to one or more of a test generation control level and a test observability control level; and
generate an updated superconductive circuit design from the superconductive circuit design based on the first testability characteristic of the first test circuitry, wherein the superconductive circuit design includes the first test circuitry at the first node.

9. The non-transitory computer readable medium of claim 8, wherein the first test circuitry is one or more of test insertion circuitry configured to receive a test signal and test extraction circuitry configured to output a test output signal.

10. The non-transitory computer readable medium of claim 8, further comprising:
determining a second testability characteristic for a second test circuitry at the first node within the superconductive circuit design, wherein a type of the first test circuitry differs from a type of the second test circuitry.

11. The non-transitory computer readable medium of claim 10, wherein generating the updated superconductive circuit design to include the first test circuitry includes selecting the first test circuitry based on a comparison of the first testability characteristic and the second testability characteristic.

12. The non-transitory computer readable medium of claim 8, wherein generating the updated superconductive circuit design to include the first test circuitry at the first node based on the first testability characteristic and comprises determining that the first testability characteristic is less than a first threshold value.

13. The non-transitory computer readable medium of claim 8, wherein generating the updated superconductive circuit design to include the first test circuitry is further based on a first overhead characteristic of the first test circuitry being less than a second threshold value.

14. The non-transitory computer readable medium of claim 13, wherein the first overhead characteristic corresponds to one or more of circuit area, power dissipation, detection time, and processing delay.

* * * * *